United States Patent
Jung et al.

(10) Patent No.: US 10,073,239 B1
(45) Date of Patent: Sep. 11, 2018

(54) DUAL PHOTODIODE FOR PHASE DETECTION AUTOFOCUS

(71) Applicant: OMNIVISION TECHNOLOGIES, INC., Santa Clara, CA (US)

(72) Inventors: Young Woo Jung, Campbell, CA (US); Chih-Wei Hsiung, San Jose, CA (US); Kazufumi Watanabe, Mountain View, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 7 days.

(21) Appl. No.: 15/594,985

(22) Filed: May 15, 2017

(51) Int. Cl.
| | | |
|---|---|---|
| *G03B 3/00* | (2006.01) | |
| *G03B 13/18* | (2006.01) | |
| *G03B 13/32* | (2006.01) | |
| *G02B 7/28* | (2006.01) | |
| *H01L 27/146* | (2006.01) | |
| *H04N 5/232* | (2006.01) | |
| *G02B 5/20* | (2006.01) | |
| *G02B 7/34* | (2006.01) | |

(52) U.S. Cl.
CPC ............ *G02B 7/28* (2013.01); *G02B 5/201* (2013.01); *G02B 7/346* (2013.01); *H01L 27/14605* (2013.01); *H01L 27/14643* (2013.01); *H04N 5/23212* (2013.01)

(58) Field of Classification Search
USPC .......................................... 396/96, 115, 121
See application file for complete search history.

(56) References Cited

U.S. PATENT DOCUMENTS

| | | | | |
|---|---|---|---|---|
| 8,658,956 | B2* | 2/2014 | Venezia | H01L 27/14603 250/208.1 |
| 8,952,485 | B2* | 2/2015 | Zhou | H01L 21/76229 257/510 |
| 9,111,993 | B1* | 8/2015 | Zheng | H01L 21/76224 |
| 9,443,899 | B1* | 9/2016 | Liu | H01L 27/14643 |
| 9,799,696 | B1* | 10/2017 | Tai | H01L 27/14643 |
| 9,923,009 | B1* | 3/2018 | Hsiung | H01L 27/1463 |
| 2006/0186505 | A1* | 8/2006 | Adkisson | H01L 27/14609 257/463 |
| 2008/0303932 | A1* | 12/2008 | Wang | H01L 27/1463 348/308 |
| 2015/0381912 | A1* | 12/2015 | Ikedo | H04N 5/361 250/208.1 |

* cited by examiner

*Primary Examiner* — Clayton E Laballe
*Assistant Examiner* — Warren K Fenwick
(74) *Attorney, Agent, or Firm* — Christensen O'Connor Johnson Kindness PLLC

(57) ABSTRACT

A phase detection autofocus image sensor includes a first photodiode in a plurality of photodiodes disposed in a semiconductor material and a second photodiode in the plurality of photodiodes. A first pinning well is disposed between the first photodiode and the second photodiode, and the first pinning well includes a first trench isolation structure that extends from a first surface of the semiconductor material into the semiconductor material a first depth. A second trench isolation structure is disposed in the semiconductor material and surrounds the first photodiode and the second photodiode. The second trench isolation structure extends from the first surface of the semiconductor material into the semiconductor material a second depth, and the second depth is greater than the first depth.

18 Claims, 4 Drawing Sheets

FIG. 2A

FRONTSIDE VIEW

BACKSIDE VIEW

FIRST SURFACE 265
SECOND SURFACE 267

B-B'
200
201, 203, 205, 211, 213, 221, 223, 231, 281

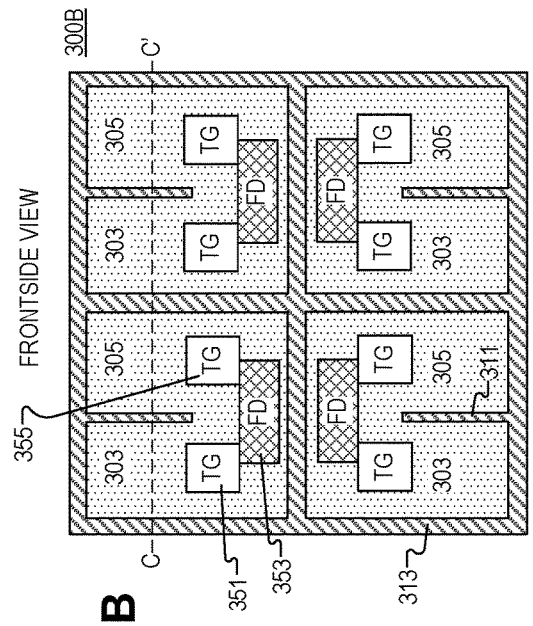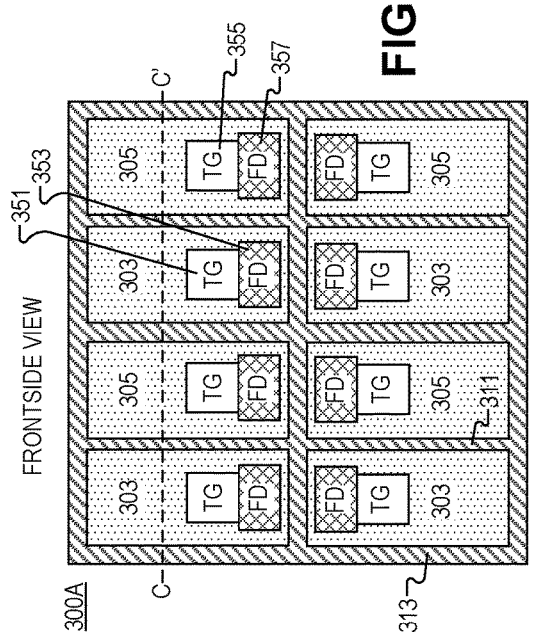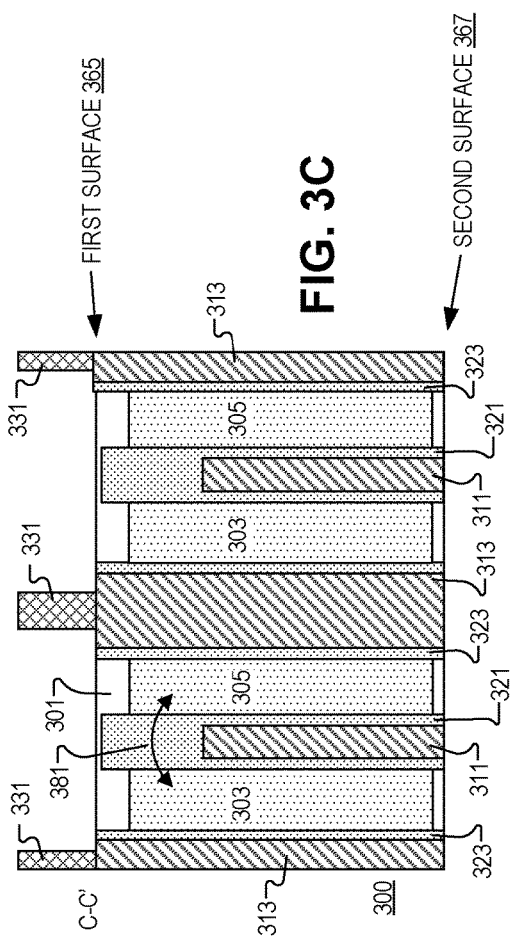

US 10,073,239 B1

DUAL PHOTODIODE FOR PHASE DETECTION AUTOFOCUS

TECHNICAL FIELD

This disclosure relates generally to semiconductor fabrication, and in particular but not exclusively, relates to CMOS image sensors.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

The typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene.

Phase detection in image sensors may be achieved by separating light incident on an image sensor into pairs of images and comparing the two images. The two images may be analyzed for similar patterns (peaks and valleys in light intensity) and separation error is calculated. This allows the image sensor determine if the object is in a front focus or back focus position. Knowing the focus of the images allows the camera to autofocus optically, digitally, or the like. Despite advances in this field, there is still appreciable room for device architecture improvement.

BRIEF DESCRIPTION OF THE DRAWINGS

Non-limiting and non-exhaustive examples of the invention are described with reference to the following figures, wherein like reference numerals refer to like parts throughout the various views unless otherwise specified.

FIGS. 2A-2C illustrate an example image sensor, in accordance with the teachings of the present invention.

FIGS. 3A-3C illustrate an example image sensor, in accordance with the teachings of the present invention.

Figure 1A:
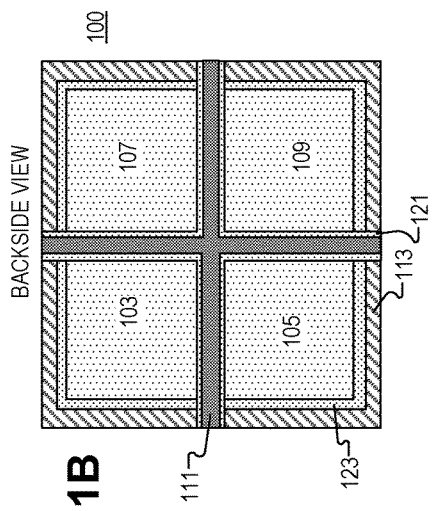
FIGS. 1A-1C illustrate an example image sensor, in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus relating to dual photodiodes for phase detection autofocus are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Figure 1B:
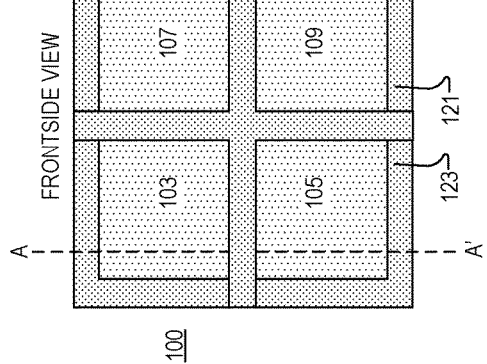
Figure 1C:
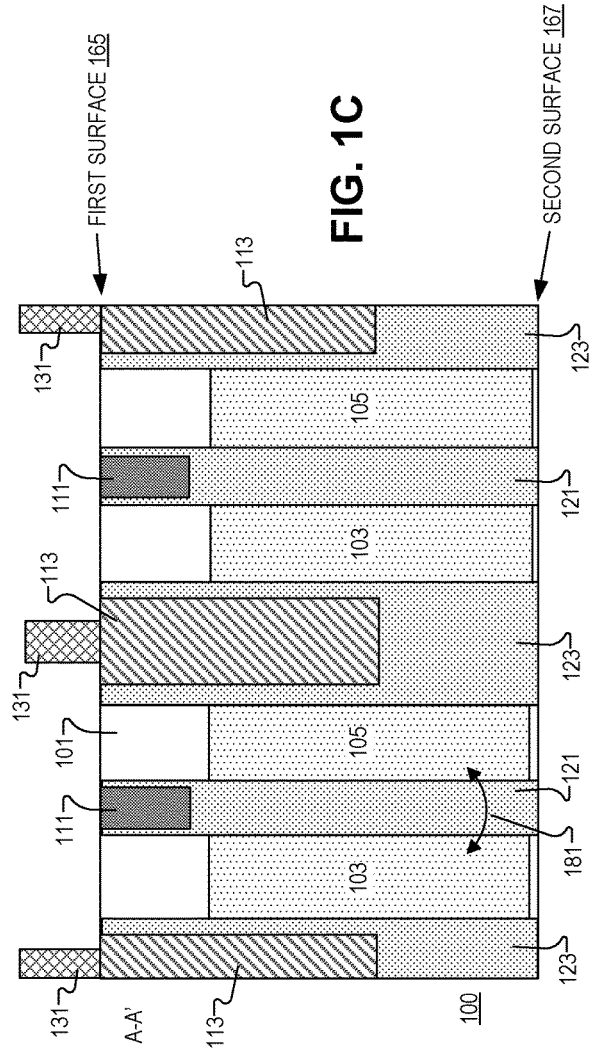

FIGS. 1A-1C illustrate an example phase detection autofocus image sensor 100. Image sensor 100 includes first photodiode 103, second photodiode 105, third photodiode 107, fourth photodiode 109, first pinning well 121, second pinning well 123, first trench isolation structure 111, second trench isolation structure 113, metal grid 131, first surface 165, second surface 167, and charge overflow path 181.

FIG. 1A depicts a "frontside view" (corresponding to second surface 167) of image sensor 100, but as one of skill in the art will appreciate, image sensor 100 may be frontside or backside illuminated in accordance with the teachings of the present disclosure. As depicted, first photodiode 103, second photodiode 105, third photodiode 107, and fourth photodiode 109 are arranged in a 2-by-2 grid, and all the photodiodes are of equal size. The four photodiodes depicted are separated from each other with first pinning well 121 (which forms a cross-like structure between the four photodiodes). In other words first photodiode 103 is separated from the other three photodiodes by first pinning well 121, second photodiode 105 is separated from the other three photodiodes by first pinning well 121, third photodiode 107 is separated from the other three photodiodes by first pinning well 121, and fourth photodiode 109 is separated from the other three photodiodes by first pinning well 121. The four photodiodes depicted are isolated from other photodiodes (depicted in FIG. 4) that may be present in an array by second pinning well 123 which surrounds the four photodiodes. In other words, the four photodiodes are encircled by second pinning well 123.

FIG. 1B shows a "backside view" (corresponding to first surface 165) of image sensor 100. As shown, first trench isolation structure 111 is disposed within the lateral bounds of first pinning well 121. Thus, first trench isolation structure 111 forms a narrower cross-like structure within the wider cross-like structure of first pinning well 121. Similarly, second trench isolation structure 113 is disposed within the lateral bounds of second pinning well 123, and second trench isolation structure 113 surrounds the four photodiodes depicted.

FIG. 1C shows a cross sectional profile of image sensor 100 as cut along line A-A'. As illustrated, first photodiode 103 is disposed in semiconductor material 101 (which in some examples may be Si or the like), and second photodiode 105 is disposed next to first photodiode 103. First pinning well 121 is disposed between first photodiode 103 and second photodiode 105, and first pinning well 121 includes first trench isolation structure 111 that extends from first surface 165 of semiconductor material 101 into semiconductor material 101 a first depth. Second trench isolation structure 113 is disposed in semiconductor material 101 and surrounds first photodiode 103 and second photodiode 105. Second trench isolation structure 113 extends from first surface 165 of semiconductor material 101 into semiconductor material 101 a second depth. As illustrated, the second depth is greater than the first depth. Metal grid 131 is disposed on first surface 165, and may be used to achieve a better signal to noise ratio by preventing optical cross talk.

In the depicted example first pinning well 121 extends from first surface 165 of semiconductor material 101 to second surface 167 of semiconductor material 101 opposite first surface 165. Similarly, second pinning well 123 extends from first surface 165 of semiconductor material 101 to second surface 167 of semiconductor material 101. Second trench isolation structure 113 is disposed in second pinning well 123.

In the depicted example first pinning well 121 is formed by doping semiconductor material 101, and accordingly, first pinning well 121 has a dopant density to provide a charge overflow path 181 between first photodiode 103 and second photodiode 185. When one of first photodiode 103 or second photodiode 105 generates image charge beyond a threshold value of image charge (which is lower than the saturation value of first photodiode 103 or second photodiode 105, respectively), charge may spill over into the neighboring photodiode to prevent saturation. This allows for the pixels to still operate in their autofocus capacity even if one absorbs too much charge to form an image. Since each photodiode needs be able to form a readable image for autofocus functionality, spillover is permitted to prevent oversaturation of any one photodiode.

The various trenches in the depicted example may include different material compositions. For instance, first trench isolation structure 111 may include an oxide material like $SiO_2$, $HfO_2$, $Al_2O_3$, and second trench isolation structure 113 may include at least one of oxide material or metal. In other examples (see e.g., FIGS. 2A-2C) the trenches may take other material configurations, in accordance with the teachings of the present disclosure. In the depicted example, the second trench isolation structure 113 may extend into semiconductor material 101 by 1.5 µm. Also, first trench isolation structure 111 may extend into semiconductor material 101 by 0.5 µm.

FIGS. 2A-2C illustrate an example image sensor 200. Image sensor 200 depicted in FIGS. 2A-2C is similar in many respects to the image sensor 100 in FIGS. 1A-1C. However, one difference is that first trench isolation structure 211 and second trench isolation structure 213 include at least one of $SiO_2$ or metal, and first trench isolation structure 211 and second trench isolation structure 213 have substantially the same material composition. In other words, they may contain the same materials, but due to imperfections in processing and the like, small differences in the compositions of the structures may result.

Also illustrated in FIG. 2C (which is a cross section of image sensor 200 as cut along line B-B') is metal gird 231 which is disposed on the first surface 265 of semiconductor material 201 and aligned with second trench isolation structures 213. In the depicted example, metal grid 231 is optically aligned with second trench isolation structures 213 to achieve enhanced signal to noise ratio (in a frontside illuminated configuration).

FIG. 3A-3C illustrate example image sensors 300A and 300B. In the depicted examples, image sensors 300A and 300B have different configurations, but have the same cross sectional profile when cut along line C-C' (illustrated in FIG. 3C). It is appreciated that the sensor configurations shown are similar to the sensor configurations depicted in FIGs. 1A-2C, in accordance with the teachings of the present disclosure. However, the sensor configurations depicted here may have enhanced performance after a metal grid (not depicted to avoid obscuring certain aspects of the disclosure; depicted as metal grid 131/231 in FIG. 1C and 2C, respectively) is placed on top of the image sensor. Moreover, using the depicted architectures directional pattern noise may be almost completely avoided which results in a better signal to noise ratio.

FIG. 3A illustrates a frontside view (e.g., second surface 367) of image sensor 300A. As shown, first photodiode 303 and second photodiode 305 are disposed side by side in semiconductor material 301, and first photodiode 303 and second photodiode 305 are separated by first trench isolation structure 311. Also, first photodiode 303 and second photodiode 305 are surrounded by second trench isolation structure 313. In this example, both the first trench isolation structure 311 and second trench isolation structure 313 are disposed in first pinning well 321 and second pinning well 323, respectively. Also in the example depicted in FIG. 3A, first floating diffusion 353 is disposed in semiconductor material 301, and first transfer gate 351 is coupled between first photodiode 303 and first floating diffusion 353 to transfer image charge from first photodiode 303 to first floating diffusion 353. Second floating diffusion 357 is disposed in semiconductor material 301, and second transfer gate 355 is coupled between second photodiode 305 and second floating diffusion 357 to transfer image charge from second photodiode 305 to the second floating diffusion 357.

FIG. 3B depicts an alternate sensor configuration (image sensor 300B) to image sensor 300A of FIG. 3A. As shown first floating diffusion 353 is disposed in semiconductor material 301, and first transfer gate 351 is coupled between first photodiode 303 and first floating diffusion 353 to transfer image charge from first photodiode 303 to first floating diffusion 353. Second transfer gate 355 is coupled between second photodiode 305 and first floating diffusion 353 to transfer image charge from second photodiode 305 to first floating diffusion 353. Thus, first transfer gate 351, second transfer gate 355, and first floating diffusion 353 form a substantially "U" shaped structure when viewed from second surface 367 of semiconductor material 301.

Also, in the depicted example, while first trench isolation structure 311 and first pining well 321 are disposed between first photodiode 303 and second photodiode 305, first trench isolation structure 311 and first pining well 321 only extend part way between these two photodiodes in a lateral direction. Thus, first photodiode 303 and second photodiode 305 are joined and also form a substantially "U" shaped structure when viewed from the first side 356 of semiconductor material 301. More specifically the center part of the "U" is formed by first trench isolation structure 311/first pining well 321 extending between first photodiode 303 and second photodiode 305.

Figure 4:
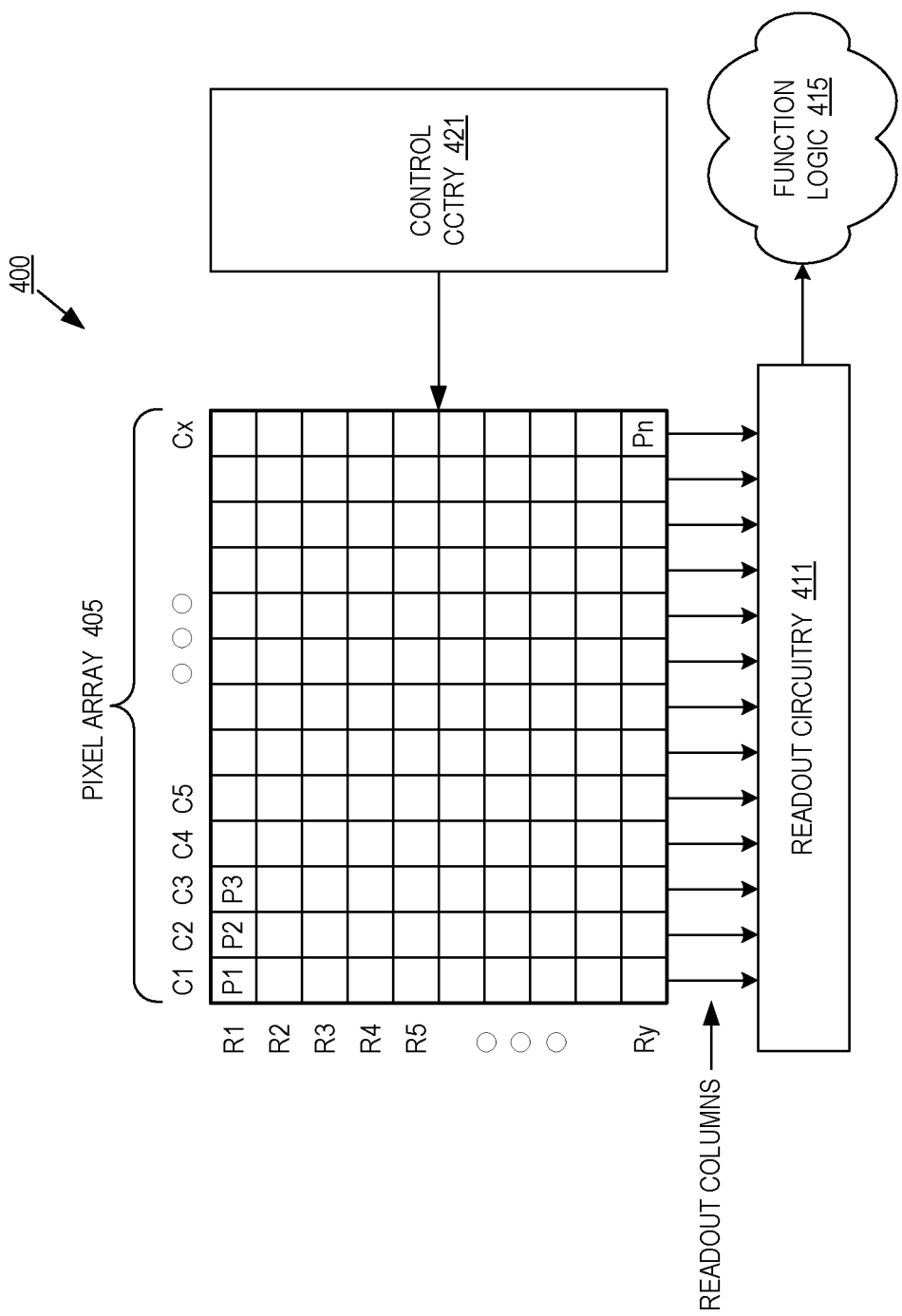
FIG. 4 is a block diagram illustrating one example of an imaging system which may include the image sensor of FIGS. 1A-3C, in accordance with the teachings of the present invention.

FIG. 4 is a block diagram illustrating one example of an imaging system 400 which may include the image sensor of FIGS. 1A-3C. Imaging system 400 includes pixel array 405, control circuitry 421, readout circuitry 411, and function logic 415. In one example, pixel array 405 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 405 has acquired its image data or image charge, the image data is readout by readout circuitry 411 and then transferred to function logic 415. In various examples, readout circuitry 411 may include amplification circuitry, analog-to-digital (ADC) conversion circuitry, or otherwise. Function logic 415 may simply store the image data or even manipulate the image data by applying post image effects (e.g., autofocus, crop, rotate, remove red eye, adjust brightness, adjust contrast, or otherwise). In one example, readout circuitry 411 may readout a row of image data at a time along readout column lines (illustrated) or may readout the image data using a variety of other techniques (not illustrated), such as a serial readout or a full parallel readout of all pixels simultaneously.

In one example, control circuitry 421 is coupled to pixel array 405 to control operation of the plurality of photodiodes in pixel array 405. For example, control circuitry 421 may generate a shutter signal for controlling image acquisition. In the depicted example, the shutter signal is a global shutter signal for simultaneously enabling all pixels within pixel array 405 to simultaneously capture their respective image data during a single acquisition window. In another example, image acquisition is synchronized with lighting effects such as a flash.

In one example, imaging system 400 may be included in a digital camera, cell phone, laptop computer, automobile or the like. Additionally, imaging system 400 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 400, extract image data from imaging system 400, or manipulate image data supplied by imaging system 400.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A phase detection autofocus image sensor, comprising:
a first photodiode in a plurality of photodiodes disposed in a semiconductor material;
a second photodiode in the plurality of photodiodes;
a first pinning well disposed between the first photodiode and the second photodiode, wherein the first pinning well includes a first trench isolation structure that extends from a first surface of the semiconductor material into the semiconductor material a first depth, and wherein the first pinning well has a dopant density to provide a charge overflow path between the first photodiode and the second photodiode when one of the first photodiode or the second photodiode includes image charge beyond a threshold value of image charge; and
a second trench isolation structure disposed in the semiconductor material and surrounding the first photodiode and the second photodiode, wherein the second trench isolation structure extends from the first surface of the semiconductor material into the semiconductor material a second depth, wherein the second depth is greater than the first depth.

2. The image sensor of claim 1, wherein the first trench isolation structure is disposed within a lateral bounds of the first pinning well.

3. The image sensor of claim 1, wherein the threshold value of image charge is below a photodiode saturation limit to permit the phase detection autofocus.

4. The image sensor of claim 1, further comprising a third photodiode and a fourth photodiode, wherein the first pinning well is disposed between the third photodiode and fourth photodiode, and wherein the second trench isolation structure surrounds the first photodiode, the second photodiode, the third photodiode, and the fourth photodiode.

5. The image sensor of claim 4, wherein the first photodiode and the second photodiode have a light absorbing area that when viewed from the first surface of the semiconductor material is a same size as a light absorbing area of the third photodiode and fourth photodiode.

6. The image sensor of claim 5, wherein the first trench isolation structure and second trench isolation structure include at least one of oxide material or metal, and wherein the first trench isolation structure and the second trench isolation structure include substantially a same material composition.

7. The image sensor of claim 5, wherein the first trench isolation structure includes oxide material and the second trench isolation structure includes at least one of oxide material or metal.

8. The image sensor of claim 1, wherein the first pinning well extends from the first surface of the semiconductor material to a second surface of the semiconductor material opposite the first surface, and wherein the second trench isolation structure is disposed in a second pinning well that extends from the first surface of the semiconductor material to the second surface of the semiconductor material.

9. The image sensor of claim 1, wherein the first pinning well extends only part way between the first photodiode and the second photodiode.

10. The image sensor of claim 9, further comprising:
a first floating diffusion and a first transfer gate coupled between the first photodiode and the first floating diffusion to transfer image charge from the first photodiode to the first floating diffusion; and
a second floating diffusion and a second transfer gate coupled between the second photodiode and the second floating diffusion to transfer image charge from the second photodiode to the second floating diffusion.

11. The image sensor of claim 1, further comprising:
a first floating diffusion and a first transfer gate coupled between the first photodiode and the first floating diffusion to transfer image charge from the first photodiode to the first floating diffusion; and a second transfer gate coupled between the second photodiode and the first floating diffusion to transfer image charge from the second photodiode to the first floating diffusion, wherein the first transfer gate, the second transfer gate, and the first floating diffusion form a substantially "U" shaped structure when viewed from the first surface of the semiconductor material.

12. An image sensor system, comprising:
a first photodiode in a plurality of photodiodes disposed in a semiconductor material;
a second photodiode in the plurality of photodiodes disposed in the semiconductor material;
a first trench isolation structure disposed in the semiconductor material that extends from a first surface of the semiconductor material into the semiconductor material a first depth;
a second trench isolation structure disposed in the semiconductor material and surrounding the first photodiode and the second photodiode, wherein the second trench isolation structure extends from the first surface of the semiconductor material into the semiconductor material a second depth, wherein the second depth is greater than the first depth;
a first pinning well including the first trench isolation structure disposed within a lateral bounds of the first pinning well, wherein the first pinning well has a dopant density to provide a charge overflow path between the first photodiode and the second photodiode when one of the first photodiode or the second photodiode includes image charge beyond a threshold value of image charge;
a second pinning well including the second trench isolation structure disposed within the lateral bounds of the second pinning well; and
control circuitry and readout circuitry coupled to the plurality of photodiodes, wherein the control circuitry is coupled to the plurality of photodiodes to control image acquisition of the plurality of photodiodes, and wherein the readout circuitry is coupled to the plurality of photodiodes to readout image data from the plurality of photodiodes.

13. The image sensor system of claim 12, wherein the threshold value of image charge is below a photodiode saturation limit, and wherein the control circuitry and readout circuitry are coupled to function logic to perform phase detection autofocus with unsaturated image charge extracted from the plurality of photodiodes.

14. The image sensor system of claim 12, further comprising a third photodiode and a fourth photodiode, wherein the first trench isolation structure is disposed between the third photodiode and fourth photodiode, and wherein the second trench isolation structure surrounds the first photodiode, the second photodiode, the third photodiode, and the fourth photodiode.

15. The image sensor system of claim 12, wherein the first trench isolation structure and second trench isolation structure include at least one of oxide material or metal, and wherein the first trench isolation structure and the second trench isolation structure include substantially a same material composition.

16. The image sensor system of claim 12, wherein the first trench isolation structure includes oxide material and the second trench isolation structure includes at least one of oxide material or metal.

17. The image sensor system of claim 12, wherein the first trench isolation structure extends only part way between the first photodiode and the second photodiode.

18. The image sensor system of claim 17, further comprising:
a first floating diffusion and a first transfer gate coupled between the first photodiode and the first floating diffusion to transfer image charge from the first photodiode to the first floating diffusion; and
a second transfer gate coupled between the second photodiode and the first floating diffusion to transfer image charge from the second photodiode to the first floating diffusion, wherein the first transfer gate, the second transfer gate and the first floating diffusion form a substantially "U" shaped structure when viewed from the first surface of the semiconductor material.

* * * * *